United States Patent
Uchiyama et al.

(10) Patent No.: US 6,326,315 B1
(45) Date of Patent: Dec. 4, 2001

(54) LOW TEMPERATURE RAPID RAMPING ANNEAL METHOD FOR FABRICATING LAYERED SUPERLATTICE MATERIALS AND MAKING ELECTRONIC DEVICES INCLUDING SAME

(75) Inventors: Kiyoshi Uchiyama, Colorado Springs, CO (US); Koji Arita, Osaka (JP); Narayan Solayappan; Carlos A. Paz de Araujo, both of Colorado Springs, CO (US)

(73) Assignees: Symetrix Corporation, Colorado Springs, CO (US); Matsushita Electronics Corporation, Osaka (JP)

( * ) Notice: Subject to any disclaimer, the term of this patent is extended or adjusted under 35 U.S.C. 154(b) by 0 days.

(21) Appl. No.: 09/523,919

(22) Filed: Mar. 9, 2000

(51) Int. Cl.$^7$ .................................................. H01L 21/31
(52) U.S. Cl. .......................... 438/758; 438/3; 438/239; 438/256; 438/386; 438/399; 437/226; 437/372; 257/296; 257/300; 257/311; 257/532
(58) Field of Search ........................ 438/758, 256, 438/239, 386, 399, 3; 257/296, 300, 311, 532; 437/226, 372

(56) References Cited

U.S. PATENT DOCUMENTS

| | | |
|---|---|---|
| 5,046,043 | 9/1991 | Miller et al. . |
| 5,434,102 | 7/1995 | Watanabe et al. . |
| 5,456,945 | 10/1995 | McMillan et al. . |
| 5,466,629 | 11/1995 | Mihara et al. . |
| 5,468,684 | 11/1995 | Yoshimori et al. . |
| 5,508,226 | 4/1996 | Ito et al. . |
| 5,519,234 | 5/1996 | Paz de Araujo et al. . |
| 5,523,964 | 6/1996 | McMillan et al. . |
| 5,648,114 | 7/1997 | Paz de Araujo et al. . |
| 5,803,961 | 9/1998 | Azuma et al. . |
| 5,825,057 | 10/1998 | Watanabe et al. . |
| 5,962,069 * | 10/1999 | Schindler et al. ............... 427/226 |
| 6,133,092 * | 10/2000 | Hayashi et al. ................. 438/256 |
| 6,140,672 * | 10/2000 | Arita et al. ..................... 257/295 |

* cited by examiner

Primary Examiner—Richard Elms
Assistant Examiner—Pho Luu
(74) Attorney, Agent, or Firm—Patton Boggs LLP

(57) ABSTRACT

A liquid precursor for forming a layered superlattice material is applied to an integrated circuit substrate. The precursor coating is annealed in oxygen using a rapid ramping anneal ("RRA") technique with a ramping rate of 50° C./second at a hold temperature of 650° C. for a holding time of 30 minutes.

27 Claims, 5 Drawing Sheets

LOW TEMPERATURE RAPID RAMPING ANNEAL METHOD FOR FABRICATING LAYERED SUPERLATTICE MATERIALS AND MAKING ELECTRONIC DEVICES INCLUDING SAME

BACKGROUND OF THE INVENTION

1. Field of the Invention

The invention in general relates to the fabrication of layered superlattice materials, and more particularly to a fabrication method that provides ferroelectric integrated circuit devices containing thin films of layered superlattice materials possessing high-polarizability, low fatigue and low-leakage current characteristics by using a low-temperature rapid ramping anneal.

2. Statement of the Problem

Ferroelectric compounds possess favorable characteristics for use in nonvolatile integrated circuit memories. See Miller, U.S. Pat. No. 5,046,043. A ferroelectric device, such as a capacitor, is useful as a nonvolatile memory when it possesses desired electronic characteristics, such as high residual polarization, good coercive field, high fatigue resistance, and low leakage current. Layered superlattice material oxides have been studied for use in integrated circuits. U.S. Pat. No. 5,434,102, issued Jul. 18, 1995, to Watanabe et al., and U.S. Pat. No. 5,468,684, issued Nov. 21, 1995, to Yoshimori et al., describe processes for integrating these materials into practical integrated circuits. Layered superlattice materials exhibit characteristics in ferroelectric memories that are orders of magnitude superior to those of PZT and PLZT compounds.

A typical ferroelectric memory in an integrated circuit contains a semiconductor substrate and a metal-oxide semiconductor field-effect transistor (MOSFET) electrically connected to a ferroelectric device, usually a ferroelectric capacitor. Layered superlattice materials currently in use and development comprise metal oxides. In conventional fabrication methods, crystallization of the metal oxides to produce desired electronic properties requires heat treatments in oxygen-containing gas at elevated temperatures. The heating steps in the presence of oxygen are typically performed at a temperature in the range of 800° C. to 900° C. for 30 minutes to two hours. As a result of the presence of reactive oxygen at elevated temperatures, numerous defects, such as dangling bonds, are generated in the single crystal structure of the semiconductor silicon substrate, leading to deterioration in the electronic characteristics of the MOSFET. Good ferroelectric properties have been achieved in the prior art using process heating temperatures at about 700° C. to crystallize layered superlattice material. See U.S. Pat. No. 5,508,226, issued Apr. 16, 1996, to Ito et al. Nevertheless, the annealing and other heating times in the low-temperature methods disclosed in the prior art are in the range of three to six hours, which may be economically unfeasible. More importantly, the long exposure times of several hours in oxygen, even at the somewhat reduced temperature ranges, results in oxygen damage to the semiconductor substrate and other elements of the CMOS circuit.

After completion of the integrated circuit, the presence of oxides may still cause problems because oxygen atoms from a thin film of metal oxide layered superlattice material tend to diffuse through the various materials contained in the integrated circuit and combine with atoms in the substrate and in semiconductor layers, forming undesired oxides. The resulting oxides interfere with the function of the integrated circuit; for example, they may act as dielectrics in the semiconducting regions, thereby forming virtual capacitors. Diffusion of atoms from the underlying substrate and other circuit layers into the ferroelectric metal oxide is also a problem; for example, silicon from a silicon substrate and from polycrystalline silicon contact layers is known to diffuse into layered superlattice material and degrade its ferroelectric properties. For relatively low-density applications, the ferroelectric memory capacitor is placed on the side of the underlying CMOS circuit, and this may reduce somewhat the problem of undesirable diffusion of atoms between circuit elements. Nevertheless, as the market demand and the technological ability to manufacture high-density circuits increase, the distance between circuit elements decreases, and the problem of molecular and atomic diffusion between elements becomes more acute. To achieve high circuit density by reducing circuit area, the ferroelectric capacitor of a memory cell is placed virtually on top of the switch element, typically a field-effect transistor (hereinafter "FET"), and the switch and bottom electrode of the capacitor are electrically connected by a conductive plug. To inhibit undesired diffusion, a barrier layer is located under the ferroelectric oxide, between the capacitors bottom electrode and the underlying layers. The barrier layer not only must inhibit the diffusion of oxygen and other chemical species that may cause problems; it must also be electrically conductive, to enable electrical connection between the capacitor and the switch. The maximum processing temperature allowable with current barrier technology is about 700° C. At temperatures above 700° C., the highest-temperature barrier materials degrade and lose their diffusion-barrier properties. On the other hand, the minimum feasible manufacturing process temperatures of layered superlattice materials used in the prior art is about 800° C., which is the temperature at which deposited layered superlattice materials, such as strontium bismuth tantalate, are annealed to achieve good crystallization.

It is common in the art to use rapid thermal processing ("RTP") before furnace annealing to improve ferroelectric ordielectric properties of deposited metal oxide thin films, in particular, of layered superlattice materials. Methods using RTP before oxygen annealing are described in U.S. Pat. No. 5,648,114, issued Jul. 15, 1997 to Paz de Araujo et al. and U.S. Pat. No. 5,825,057, issued Oct., 20, 1998 to Watanabe et al. The RTP disclosed in the prior art is typically conducted at a temperature of 700° C. to 850° C. for a hold time of about 30 seconds, followed by an oxygen furnace anneal at 800° C. for 30 to 60 minutes. These process temperatures exceed the desired range, described above, which is less than 700° C.

For the above reasons, therefore, it would be useful to have a low-temperature method for fabricating layered superlattice materials in ferroelectric integrated circuits that minimizes the time of exposure to oxygen at elevated temperature, as well as reduces the maximum temperatures used.

SOLUTION

The embodiments of the present invention reduce fabrication processing temperatures and reduce the time of exposure of the integrated circuit to oxygen gas at elevated temperature.

An important feature of a method in accordance with the invention is a Rapid Ramping Anneal ("RRA") technique. In an RRA, the temperature of a deposited thin film of metal moieties is ramped up to a "hold temperature" at a rapid ramping rate, and held at the hold temperature for a time period, the "holding time", greater than 5 minutes. Typically, a liquid precursor is deposited on a substrate, dried to form a solid film, and then an RRA is conducted. An RRA technique in accordance with the invention may also be used in combination with a CVD deposition process.

The RRA method may be conducted in an RRA apparatus similar or identical to a conventional rapid thermal processing ("RTP") apparatus. A significant difference between an RRA technique in accordance with the invention and an RTP technique is that the holding time of an RRA is significantly longer than the holding time of a typical RTP. In accordance with the invention, the holding time at the hold temperature is greater than 5 minutes, and typically no more than 120 minutes. Preferably, the holding time is about 30 minutes. In accordance with the invention, an RRA technique is conducted in an oxygen-containing atmosphere to enhance formation of the metal oxide bonds in polycrystalline layered superlattice materials and other ferroelectric or dielectric compounds. It is contemplated, however, that an oxygen-free unreactive atmosphere may be used for a significant part of the holding time.

A method in accordance with the invention includes rapidly ramping the temperature in the oven of the RRA apparatus up to the hold temperature. It is contemplated, however, that a plurality of hold temperatures may be used. As a result of the RRA, the annealing of the layered superlattice material, or other dielectric or ferroelectric metal oxide, occurs substantially at the hold temperature, rather than the lower temperature region. That is, using RRA, the crystalization process proceeds directly into the high temperature crystalline phase, thus reducing or eliminating altogether the generation of the low temperature crystalline phases, which are referred to in the art as the "fluorite phases". The actual ramping rate is typically in the range of from 10° C. to 100° 1 C. per second, preferably about 50° C. per second. Typically, the hold temperature is the maximum temperature reached during the RRA. After annealing at the RRA hold temperature, the substrate may be cooled using conventional cooling techniques.

In accordance with the invention, the crystallization of layered superlattice material, or other ferroelectric or dielectric material, depends on numerous factors. These factors include: ramping rate, holding time, hold temperature, and oxygencontent of the RRA atmosphere, as well as the composition of the liquid precursor and the desired metal oxide material.

Ferroelectric layered superlattice materials, like the metal oxides $SrBi_2Ta_2O_9$ (SBT) and $SrBi_2(Ta_{1-x}NB_x)_2O_9$ (SBTN), where $0 \leq x \leq 1$, are particularly useful in nonvolatile memory applications, such as in FeRAMs and nondestructible read-out ferroelectric FETs. Polycrystalline thin films of these layered superlattice materials, as well as other layered superlattice materials, may be fabricated in accordance with the invention.

In accordance with the invention, an RRA hold temperature suitable for forming a layered superlattice material is in the range of from 500° C. to 750° C., preferably between 600° C. and 700° C. For ferroelectric layered superlattice materials, such as strontium bismuth tantalate, $SrBi_2Ta_2O_9$, and strontium bismuth tantalate, $SrBi_2(Ta_{1-x}Nb_x)_2O_9$, $0 \leq x \leq 1$, conducting the RRA with a nominal ramping rate of 100° C./second and a holding time of 30 minutes at a hold temperature of 650° C. results in high remanent polarization values.

It is a feature of the invention that it is not necessary to conduct an oxygen furnace anneal after the RRA. Thus, in certain embodiments in accordance with the invention, an RRA is the only heating technique performed in an oxygen-containing atmosphere to promote reaction and crystallization in the deposited thin film to form the desired polycrystalline layered superlattice material. Because heating of a ferroelectric or a dielectric metal oxide thin film by RRA is very effective compared with other heating techniques, such as furnace annealing, the maximum temperatures used in the complete fabrication process and the total time of exposure to oxygen at elevated temperatures are minimized.

After the RRA has been conducted, the substrate containing the layered superlattice material thin film may optionally be given an oxygen furnace anneal. An oxygen furnace anneal conducted after an RRA tends to increase the remanent polarization of the layered superlattice material.

In embodiments of the invention in which a liquid precursor is deposited as a liquid coating on a substrate, the RRA is typically preceded by a step of baking the coating on the substrate at a temperature not exceeding 400° C., typically in an oxygen-containing ambient, typically in $O_2$ gas.

In one aspect of the invention, the substrate comprises a first electrode, and the method includes steps of forming a second electrode on the thin film of layered superlattice material, after the RRA, to form a memory capacitor, and subsequently performing a step of post-annealing. Post-annealing may be conducted using an RRA technique, referred to as "post-RRA". In a preferred embodiment, the first electrode and the second electrode contain platinum and titanium. The post-RRA is conducted at a temperature in the range of from 500° C. to 750° C., preferably at a hold temperature and for a holding time similar to those of the RRA conducted to anneal the thin film. In one embodiment of the invention, the post-annealing is conducted in an oxygen-containing ambient, typically in $O_2$ gas. Preferably, an electrically conductive barrier layer is formed on the substrate prior to applying the precursor coating.

The thin film of layered superlattice material typically has a thickness in a range of from 40 nm to 500 nm, preferably from 40 nm to 200 nm.

Numerous other features, objects and advantages of the invention will become apparent from the following description when read in conjunction with the accompanying drawings.

DETAILED DESCRIPTION OF THE PREFERRED EMBODIMENT

1. Overview

Figure 1:
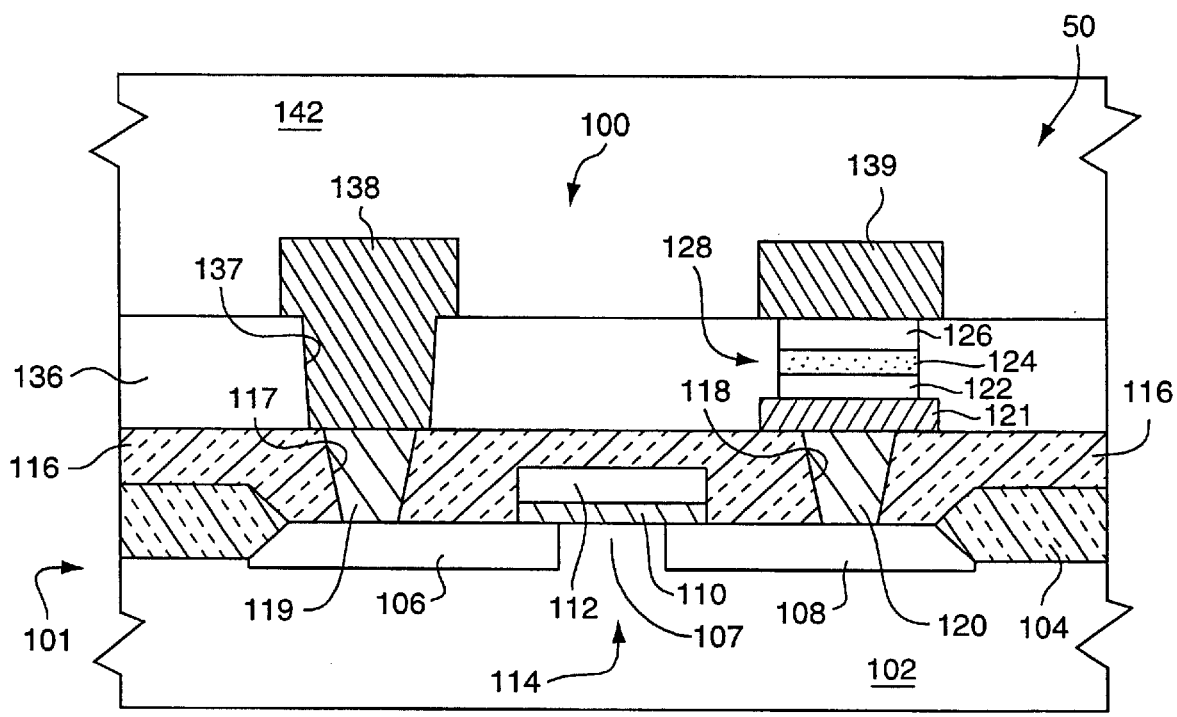
FIG. 1 is a schematic of a cross-sectional view of a portion of an integrated circuit as may be fabricated by the method of the invention showing a nonvolatile ferroelectric memory cell in which the capacitor is located above the switch.
Figure 2:
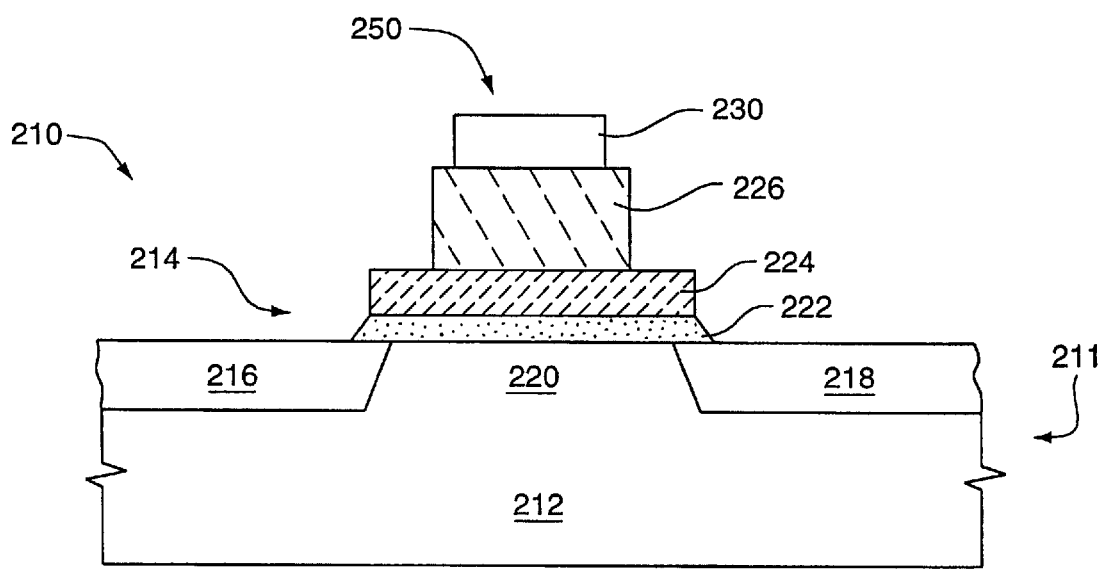
FIG. 2 shows a cross-sectional view of a portion of a ferroelectric FET memory that may be fabricated using a method in accordance with the invention.

It should be understood that FIGS. 1 and 2, depicting integrated circuit devices, are not meant to be actual plan or cross-sectional views of any particular portion of actual integrated circuit devices. In actual devices, the layers will not be as regular and the thicknesses may have different proportions. The various layers in actual devices often are curved and possess overlapping edges. The figures instead show idealized representations which are employed to explain more clearly and fully the method of the invention than would otherwise be possible. Also, the figures represent only one of innumerable variations of ferroelectric and dielectric devices that could be fabricated using the method of the invention. For example, FIG. 1 depicts a portion of a ferroelectric memory 100 containing a switch in the form of a field effect transistor 114 in electrical connection with a ferroelectric capacitor 128. Although the ferroelectric element 124 depicted in FIG. 1 is substantially above the switch element 114, the invention may be used, for example, to fabricate a thin film of layered superlattice material in an element displaced to the side of the switch. In addition, a method in accordance with the invention may also be used to fabricate a ferroelectric FET memory in which the ferroelectric element comprising layered superlattice material is incorporated in the switch element. Such a ferroelectric FET, as depicted in FIG. 2, was described in McMillan, U.S. Pat. No. 5,523,964, issued Jun. 4, 1996, and U.S. patent application Ser. No. 09/365,628 filed Aug. 2, 1999 which are hereby incorporated by reference as if fully disclosed herein.

FIG. 1 shows a cross-sectional view of an exemplary nonvolatile ferroelectric memory 100 fabricated in accordance with the invention. The general manufacturing steps for fabricating integrated circuits containing MOSFETs and ferroelectric capacitor elements are described in Mihara, U.S. Pat. No. 5,466,629, and Yoshimori, U.S. Pat. No. 5,468,684, which are hereby incorporated by reference as if fully disclosed herein. General fabrication methods have been described in other references also. Therefore, the elements of the circuit of FIG. 1 will be simply identified here.

FIG. 1 shows a memory cell 50 of a ferroelectric random access memory 100. Memory cell 50 includes a transistor switch 114 and a capacitor 128 formed on a semiconductor wafer 101. In the embodiment shown, transistor 114 is a MOSFET and includes source region 106, drain region 108, a channel region 107, gate insulating layer 110 and gate electrode 112. Capacitor 128 includes bottom electrode 122, ferroelectric layer 124, and top electrode 126. A field oxide region 104 is formed on a surface of a silicon substrate 102. Source region 106 and a drain region 108 are formed separately from each other within silicon substrate 102. A gate insulating layer 110 is formed on the silicon substrate 102 between the source and drain regions 106 and 108. Further, a gate electrode 112 is formed on the gate insulating layer 110.

A first interlayer dielectric layer (ILD) 116 made of BPSG (boron-doped phospho-silicate glass) is formed on substrate 102 and field oxide region 104. ILD 116 is patterned to form vias 117, 118 to source region 106 and drain region 108, respectively. Vias 117, 118 are filled to form plugs 119, 120, respectively. Plugs 119, 120 are electrically conductive and typically comprise polycrystalline silicon. A diffusion barrier layer 121 is formed and patterned on ILD 116 to be in electrical contact with plug 120. The diffusion barrier layer 121 is made of, for example, titanium nitride, and typically has a thickness of 10 nm to 20 nm. Diffusion barrier layers, such as titanium nitride, inhibit the diffusion of chemical species between the underlying and overlying layers of the memory 100.

As depicted in FIG. 1, a bottom electrode layer 122 made of platinum and having a thickness of 100 nm is deposited on diffusion barrier layer 121. Then a ferroelectric thin film 124 of layered superlattice material is formed in accordance with the invention on bottom electrode layer 122. A top electrode layer 126, made of platinum and having a thickness of 100 nm, is formed on ferroelectric thin film 124.

Wafer substrate 102 may comprise silicon, gallium arsenide or other semiconductor, or an insulator, such as silicon dioxide, glass or magnesium oxide (MgO). The bottom and top electrodes of ferroelectric capacitors conventionally contain platinum. It is preferable that the bottom electrode contains a non-oxidized precious metal such as platinum, palladium, silver, and gold. In addition to the precious metal, metal such as aluminum, aluminum alloy, aluminum silicon, aluminum nickel, nickel alloy, copper alloy, and aluminum copper may be used for electrodes of a ferroelectric memory. Adhesive layers (not shown), such as titanium, enhance the adhesion of the electrodes to adjacent underlying or overlying layers of the circuits.

A second interlayer dielectric layer (ILD) 136 made of NSG (nondoped silicate glass) is deposited to cover ILD 116, diffusion barrier layer 121, and ferroelectric capacitor 128. A PSG (phospho-silicate glass) film or a BPSG (boron phospho-silicate glass) film could also be used in layer 136.

ILD 136 is patterned to form a via 137 to plug 119. A metallized wiring film is deposited to cover ILD 136 and fill via 137 and then patterned to form plug 137, source electrode wiring 138 and top electrode wiring 139. Wirings 138, 139 preferably comprise Al—Si—Cu standard interconnect metal with a thickness of about 200 nm to 300 nm.

FIG. 2 shows a cross-sectional view of a portion of a ferroelectric FET memory 210 as may be fabricated using a method in accordance with an embodiment of the invention. Memory 210 comprises a ferroelectric FET 250 formed on a wafer 211, comprising a standard semiconductor material 212, preferably a p-100 silicon material. A semiconductor substrate 214 comprises a highly doped source region 216 and a highly doped drain region 218, which are formed about a doped channel region 220. Doped source region 216, drain region 218 and channel region 220 are preferably n-type doped regions, but also may be p-type regions formed in an n-type semiconductor. Semiconductor substrate 214 typically also includes a gate oxide 222, located usually above channel region 220, but which can extend beyond channel region 220 to cover parts of source region 216, drain region 218 and other parts of semiconductor material 212. Typically, gate oxide 222 is formed from the semiconductor material 212 during high temperature process steps. When the semiconductor material 212 is silicon, then gate oxide 222 usually comprises silicon dioxide. An interface insulator layer 224 may be formed above semiconductor substrate 214 above channel 220, usually on gate oxide 222. A ferroelectric thin film 226, formed in accordance with the invention, is located above interface insulator layer 224 and channel region 218, usually on interface insulator layer 224. Gate electrode 230 is formed above ferroelectric thin film 226, usually on ferroelectric thin film 226. Semiconductor substrate 214, including source region 216, drain region 218, channel region 220, and gate oxide 222, together with interface insulator layer 224, ferroelectric thin film 226 and gate electrode 230 form ferroelectric FET memory 210. Typically, memory 210 is covered by an interlayer dielectric ("ILD"), comprising a glasseous oxide, preferably a boron-doped phosphosilicate glass ("BPSG"). For purposes of simplicity and clarity, the ILD and some other structural elements and insulating layers are not shown because they are well-known in the art.

U.S. Pat. No. 5,519,234 issued May 21, 1996, to Carlos A. Paz de Araujo et al., is hereby incorporated herein by reference as though fully disclosed herein, and discloses that layered superlattice compounds, such as strontium bismuth tantalate, have excellent properties in ferroelectric applications as compared to the best prior materials and have high dielectric constants and low leakage currents. U.S. Pat. No. 5,434,102 issued Jul. 18, 1995, to Watanabe et al. and U.S. Pat. No. 5,468,684 issued Nov. 21, 1995, to Yoshimori et al., also both hereby incorporated by reference as though fully disclosed herein, describe processes for integrating these materials into practical integrated circuits.

The layered superlattice materials may be summarized generally under the formula:

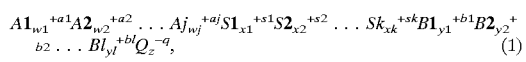

$$b2 \ldots Bl_{yl}^{+bl}Q_z^{-q}, \quad (1)$$

where A1, A2 . . . Aj represent A-site elements in the perovskite-like structure, which may be elements such as strontium, calcium, barium, bismuth, lead, and others; S1, S2 . . . Sk represent superlattice generator elements, which usually is bismuth, but can also be materials such as yttrium, scandium, lanthanum, antimony, chromium, thallium, and other elements with a valence of +3; B1, B2 . . . B1 represent B-site elements in the perovskite-like structure, which may be elements such as titanium, tantalum, hafnium, tungsten, niobium, zirconium, and other elements; and Q represents an anion, which generally is oxygen but may also be other elements, such as fluorine, chlorine and hybrids of these elements, such as the oxyfluorides, the oxychlorides, etc. The superscripts in formula (1) indicate the valences of the respective elements; for example, if Q is oxygen, then q=2. The subscripts indicate the number of moles of the material in a mole of the compound, or in terms of the unit cell, the number of atoms of the element, on the average, in the unit cell. The subscripts can be integer or fractional. That is, formula (1) includes the cases where the unit cell may vary uniformly throughout the material; for example, in $SrBi_2(Ta_{0.75}Nb_{0.25})_2O_9$, 75% of the B-sites are occupied by strontium atoms, and 25% of the B-sites are occupied by barium atoms. If there is only one A-site element in the compound, then it is represented by the "A1" element and w2 . . . wj all equal zero. If there is only one B-site element in the compound, then it is represented by the "B1" element, and y2 . . . yl all equal zero, and similarly for the superlattice generator elements. The usual case is that there is one A-site element, one superlattice generator element, and one or two B-site elements, although formula (1) is written in the more general form since the invention is intended to include cases where either of the sites and the superlattice generator can have multiple elements. The value of z is found from the equation:

$$(a1w1+a2w2 \ldots +ajwj)+(s1x1+s2x2 \ldots +skxk)+(b1y1+b2y2 \ldots +blyl)=qz. \quad (2)$$

Formula (1) includes all three of the Smolenskii type compounds discussed in U.S. Pat. No. 5,519,234 issued May 21, 1996, referenced above. The layered superlattice materials do not include every material that can be fit into Formula (1), but only those which spontaneously form themselves into crystalline structures with distinct alternating layers.

U.S. Pat. No. 5,803,961, issued Sep. 8, 1998, to Azuma et al., which is hereby incorporated herein by reference as though fully disclosed herein, discloses that mixed layered superlattice materials, such as strontium bismuth tantalum niobate, can have even more improved properties in ferroelectric applications. The mixed layered superlattice materials are characterized by nonstoichiometric amounts of A-site and B-site elements. For example, a preferred precursor used in accordance with the invention comprises metal organic precursor compounds having metals in relative molar proportions corresponding to the stoichiometrically unbalanced formula $Sr_{0.8}Bi_2(Ta_{0.7}Nb_{0.3})_2O_{8.8}$.

Currently, ferroelectric layered superlattice materials, like the metal oxides $SrBi_2Ta_2O_9$(SBT), $SrBi_2(Ta_{1-x}Nb_x)_2O_9$ (SBTN), where $0 \leq x \leq 1$, and particularly $Sr_aBi_b(Ta_{1-x}Nb_x)_cO_{[9+(a-)+(b-2)(1.5)+(c-2)(2.5)]}$, where $0.8 \leq a \leq 1$, $2 \leq b \leq 2.2$, $0 \leq x \leq 0.3$ and $1.9 \leq c \leq 2.1$ (SBTN), are being used and are under further development for use as capacitor dielectric in nonvolatile memory applications, such as in FeRAMs and nondestructible read-out ferroelectric FETs. Polycrystalline thin films of these layered superlattice materials, as well as other layered superlattice materials represented by Formula (1), may be fabricated and used in accordance with the invention.

The word "substrate" can mean the underlying semiconductor material 102, 212 on which the integrated circuit is formed, as well as any object on which a thin film layer is deposited. In this disclosure, "substrate" shall generally mean the object to which the layer of interest is applied. For example, when we are talking about a ferroelectric thin film 124 of FIG. 1, the substrate on which it is formed may include various elements, in particular, bottom electrode 122. The term "semiconductor substrate" is more specific than substrate. For example, as used in FIG. 2, "semiconductor substrate 214" refers to those elements of the circuit having origins in the original semiconductor material of the starting wafer, such as from the p-100 crystalline silicon material 212 of FIG. 2. Thus, in the example of the structure of FIG. 2, "semiconductor substrate 214" includes elements 212, 216, 218, 220.

The long dimensions of semiconductor substrate 214 and semiconductor material 102 define planes that are considered to be a "horizontal" plane herein, and directions perpendicular to this plane are considered to be "vertical". The terms "lateral" or "laterally" refer to the direction of the flat plane of the semiconductor substrate, that is, parallel to the horizontal direction.

Terms of orientation herein, such as "above", "top", "upper", "below", "bottom" and "lower", mean relative to the substrate 102, 214. That is, if a second element is "above" a first element, it means it is farther from the semiconductor substrate 102, 214; and if it is "below" another element then it is closer to the semiconductor substrate 102, 214 than the other element. Terms such as "above" and "below" do not, by themselves, signify direct contact. However, terms such as "on" or "onto" do signify direct contact of one layer with an underlying layer.

The term "thin film" is used herein as it is used in the integrated circuit art. Generally, it means a film of less than a micron in thickness. The thin films disclosed herein are typically less than 500 nm in thickness. A thin film of layered superlattice material fabricated by a method in accordance with the invention typically has a final thickness in a range of from 40 nm to 500 nm, preferably in a range of from 40 nm to 300 nm. These thin films of the integrated circuit art should not be confused with the layered capacitors of the macroscopic capacitor art which are formed by a wholly different process that is incompatible with the integrated circuit art.

The term "stoichiometric" herein may be applied to both a solid film of a material, such as a layered superlattice material, or to the precursor for forming a material. When it is applied to a solid thin film, it refers to a formula which shows the actual relative amounts of each element in a final solid thin film. When applied to a precursor, it indicates the molar proportion of metals in the precursor. A "balanced" stoichiometric formula is one in which there is just enough of each element to form a complete crystal structure of the material with all sites of the crystal lattice occupied, though in actual practice there always will be some defects in the crystal at room temperature. For example, both $SrBi_2(TaNb)O_9$, and $SrBi_2(Ta_{1.5}Nb_{0.5})O_9$ are balanced stoichiometric formulae. In contrast, a precursor for strontium bismuth tantalum niobate in which the molar proportions of strontium, bismuth, tantalum, and niobium are 0.9, 2.18, 1.5, and 0.5, respectively, is represented herein by the unbalanced "stoichiometric" formula $Sr_{0.9}Bi_{2.18}(Ta_{1.5}Nb_{0.5})O_9$, since it contains excess bismuth and deficient strontium relative to the B-site elements tantalum and niobium. It is common in the art to write an unbalanced stoichiometric formula of a metal oxide in which the subscript of the oxygen symbol is not corrected to balance completely the subscript values of the metals.

The word "precursor" used herein can mean a solution containing one metal organic solute that is mixed with other precursors to form intermediate precursors or final precursors, or it may refer to a final liquid precursor solution, that is, the solution to be applied to a particular surface during fabrication. The precursor as applied to the substrate is usually referred to as the "final precursor", "precursor mixture", or simply "precursor". In any case, the meaning is clear from the context.

A "precursor compound" in this disclosure refers to a metal organic compound containing at least one metal that is included in the desired layered superlattice material of the thin film formed in accordance with the invention. The metal organic precursor compounds disclosed herein are useful because they can be easily dissolved in organic liquid precursor solutions, which can be stored until used. In a preferred liquid-source misted chemical deposition ("LSMCD") method in accordance with the invention, one or more liquid precursor solutions are atomized to form a mist that contains precursor compounds suitable for formation of the desired thin film. The composition of a precursor solution may be described in two ways. The actual dissolved metal organic precursor compounds (solutes) and solvents and concentrations may be specified; or, for the sake of clarity, the stoichiometric formula representing the composition of the final oxide compound to be formed with the precursor may be specified. Similarly, a precursor compound may be described using its name or stoichiometric formula, or it may simply be identified by the metal atoms it contains.

Metal organic precursor compounds and liquid precursor solutions used in accordance with the invention can be manufactured reliably. Their composition can be easily controlled and varied, if necessary. They can be safely stored for long periods, up to six months. They are relatively nontoxic and nonvolatile, compared with many precursors of the prior art. Thin film layers formed in accordance with the invention have smooth, continuous and uniform surfaces, and they can be reliably fabricated to have thicknesses in the range of from 40 nm to 500 nm, maintaining important structural and electrical characteristics.

It should be understood that the specific processes and electronic devices described herein are exemplary; that is, the invention contemplates that the layers in FIGS. 1 and 2 may be made of many other materials than those mentioned above and described below. There are many other variations of the method of the invention than can be included in a document such at this, and the method and materials may be used in many other electronic devices other than integrated circuit devices 100 and 210.

The term "actual ramping rate" applies to the rate of temperature increase actually experienced in the integrated circuit substrate. The term "nominal ramping rate" is used to designate the control setting of an RRA or RTP apparatus. For example, for a nominal ramping rate of 100° C. per second, the actual ramping rate is typically about 60° C. per second.

Terms such as "heating", "drying", "baking", "rapid ramping anneal" ("RRA"), "rapid thermal process" ("RTP"), "furnace anneal", and others all involve the application of heat. For the sake of clarity, the various terms are used in the art to distinguish certain techniques and method steps from one another. Nevertheless, it is clear that similar techniques may be used to accomplish differently named process steps; for example, drying, baking and furnace annealing may typically be accomplished using the same apparatus, the only differences being their function and position in a fabrication sequence, or the particular temperatures used. As a result, it would be possible to designate an annealing step as a heating step, or a drying step as a baking step. To avoid confusion, therefore, the general term "heating" may also be used to describe a fabrication step. A rapid ramping anneal (RRA) technique in accordance with the invention, as also an RTP technique, is distinct from other heating techniques in being characterized by a very rapid rise in temperature, typically at an actual ramping rate of 10° to 100° C. per second. It is further understood that one skilled in the art may accomplish a desired process result using heat as disclosed herein, while referring to the process with a term different from the one used herein.

2. Description of Preferred Method

In general, some form of heating or annealing of a deposited metal-containing film in oxygen at elevated temperature is necessary for desired formation and crystallization of the desired metal oxide layered superlattice material. An important feature of embodiments of the invention is that the maximum temperature and the total heating times at elevated temperature are minimized compared to the prior art. In the embodiments described in detail in this specification, RRA and annealing treatments are conducted in oxygen-containing gas. The invention also includes, however, embodiments in which annealing in an oxygen-containing gas for part of the total time is followed by annealing in an unreactive gas. The term "elevated temperature" as used herein generally refers to a temperature in excess of 300° C. The term "gas" is used in its broader sense of being either a pure gas or a mixture of several gases. The term "oxygen-containing" means that the relative amount of oxygen present is not less than one mole-percent.

Individual precursor compounds of a precursor solution for fabricating a layered superlattice material thin film may be selected from the group including metal beta-diketonates, metal polyalkoxides, metal dipivaloylmethanates, metal cyclopentadienyls, metal alkoxycarboxylates, metal carboxylates, metal alkoxides, metal ethylhexanoates, octanoates, and neodecanoates. Preferably, a metal precursor compound comprises a metal 2-ethylhexanoate, which is well suited for use in a liquid-source misted chemical deposition ("LSMCD") technique. An individual metal organic decomposition ("MOD") precursor compound is formed, for example, by interacting each metal of a desired compound, for example, strontium, bismuth, tantalum or niobium, or an alkoxide of the metal, with a carboxylic acid, or with a carboxylic acid and an alcohol, and dissolving the reaction product in a solvent. Carboxylic acids that may be used include 2-ethylhexanoic acid, octanoic acid, and neo-decanoic acid, preferably 2-ethylhexanoic acid. Alcohols that may be used include 2-methoxyethanol, 1-butanol, 1-pentanol, and 2-pentanol. Solvents that may be used include xylenes, -octane, n-butyl acetate, n-dimethylformamide, 2-methoxyethyl acetate, methyl isobutyl ketone, and methyl isoamyl ketone, as well as many others. The metal, metal alkoxide, acid, and alcohol react to form a mixture of metalal-koxocarboxylate, metal-carboxylate and/or metal-alkoxide, which mixture is heated and stirred as necessary to form metal-oxygen-metal bonds and boil off any low-boiling point organics that are produced by the reaction. Initial MOD precursors are usually made or bought in batches prior to their use; the final precursor mixtures are usually prepared immediately before application to the substrate. Final preparation steps typically include mixing, solvent exchange, and dilution. When using a liquid deposition technique, for example, LSMCD, a metal 2-ethylhexanoate is a preferred precursor compound because the ethylhexanoates are stable in solution, have a long shelf life, form smooth liquid films, and decompose smoothly on a substrate. The ethoxyhexanoates and other metalorganic precursor compounds may be stored for periods of several months when dissolved in xylenes or n-octane.

Figure 3:
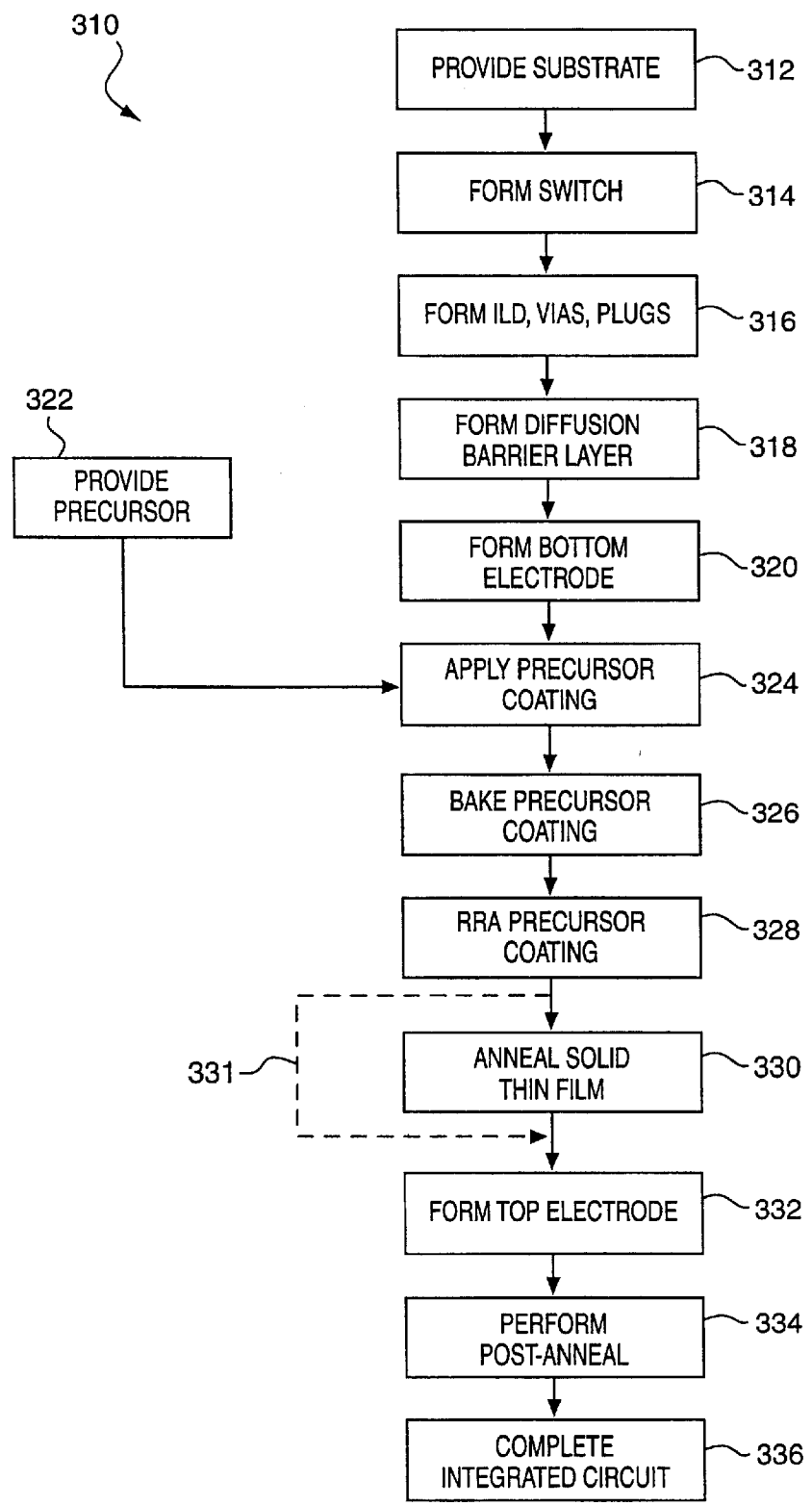
FIG. 3 is a flow chart of a preferred method for depositing a thin film of layered superlattice material in accordance with the invention.

The diagram of FIG. 3 is a flow sheet of the fabrication steps of a method 310 in accordance with the invention to make a ferroelectric memory as depicted in FIG. 1. Although method 310 of FIG. 3 is discussed herein with reference to FIG. 1, it is clear that the method of FIG. 3 and numerous variations of the method in accordance with the invention may be used to fabricate thin films of polycrystalline layered superlattice materials of other compositions in various types of ferroelectric structures of the integrated circuit art.

In step 312, a semiconductor substrate is provided on which a switch is formed in step 314. The switch is typically a MOSFET. In step 316, an insulating layer is formed by conventional techniques to separate the switching element from the ferroelectric element to be formed. Using conventional processes, the insulating layer is patterned to form vias, which are filled with conductive plugs to electrically connect the switch to the memory capacitor and the rest of the integrated circuit. In step 318, a diffusion barrier layer is deposited on the insulating layer and patterned. Preferably, the diffusion barrier comprises titanium nitride and has a thickness of about 10 nm to 20 nm. Preferably, the diffusion barrier is deposited by a conventional sputtering method, using a titanium nitride target, although a titanium target with a nitrogen-containing sputter gas may also be used. In step 320, a bottom electrode is formed. Preferably, the electrode is made of platinum and is sputter-deposited to form a layer with a thickness of about 200 nm. In step 322, chemical precursors of the layered superlattice material that will form the desired ferroelectric thin film are prepared. Usually, precursor solutions are prepared from commercially available solutions containing the chemical precursor compounds. If necessary, the concentrations of the various precursors supplied in the commercial solutions are adjusted in step 322 to accommodate particular manufacturing or operating conditions. Preferred embodiments of the inventive method utilize a final liquid precursor solution containing relative molar proportions of the elements strontium, bismuth, tantalum and niobium corresponding approximately to $SrBi_2Ta_2O_9$ (SBT), $SrBi_2(Ta_{1-x}Nb_x)_2O_9$ (SBTN), where $0 \leq x \leq 1$, and particularly $Sr_aBi_b(Ta_{1-x}Nb_x)_cO_{[9+(a-1)+(b-2)(1.5)+(c-2)(2.5)]}$, where $0.8 \leq a \leq 1$, $2 \leq b \leq 2.2$, $0 \leq x \leq 0.3$ and $1.9 \leq c \leq 2.1$. A liquid coating of precursor solution is applied to the substrate in step 324. The precursor for forming the ferroelectric thin film of layered superlattice material is applied as a coating on the bottom electrode in step 324. In accordance with the invention, the precursor may be applied using a conventional liquid deposition technique, such as a misted deposition method as described in U.S. Pat. No. 5,456,945, or a spin-coating method. In the examples below, the substrate was applied using a liquid-source misted chemical deposition ("LSMCD") process. In drying step 326, the substrate with the coating of liquid precursor is baked and dried at a temperature not exceeding 300° C. Preferably, the drying step is conducted on a hot plate in substantially pure $O_2$ gas, or at least in an oxygen-containing gas, for a time period not exceeding 15 minutes.

In step 328, the dried precursor coating on the substrate is subjected to a rapid ramping anneal ("RRA"). The RRA is conducted at a temperature in a range of from 500° C. to 750° C., for a time period in the range of from 5 minutes to 120 minutes. Preferably, the RRA is conducted at a temperature of from 600° C. to 700° C. for 30 minutes with an actual ramping rate in a range of from 10° to 100° C. per second, preferably about 50° C. per second. Radiation from a halogen lamp, an infrared lamp, or an ultraviolet lamp provides the source of heat for the RRA step. In the examples below, an AG Associates model 410 Heat Pulser utilizing a halogen source at ambient atmospheric pressure was used. The RRA is performed in an oxygen-containing gas, preferably in substantially pure $O_2$ gas, for at least part of the total holding time. Any residual organics are burned out and vaporized during the RRA process. At the same time, the rapid temperature rise of the RRA promotes nucleation; that is, the generation of numerous crystalline grains of layered superlattice material in the solid film resulting from steps 324 and 326. These grains act as nuclei upon which further crystallization can occur. The presence of oxygen in the RRA process enhances formation of these grains.

Anneal step 330 typically involves a furnace anneal of the thin film of layered superlattice material. Dashed line 331, bypassing step 330, indicates that step 330 is optional. A furnace anneal in step 330 is preferably conducted at a temperature in a range of from 0° C. to 50° C. less than the hold temperature of step 328. A furnace anneal in step 330 is usually performed in an oxygen-containing gas, but it may also be conducted in an unreactive gas. Preferably, the annealing time of step 330 in oxygen does not exceed 60 minutes; typically, a furnace anneal in oxygen-containing gas is for 30 minutes at 650° C. In contrast, the annealing time of step 330 in the unreactive gas may be relatively long; for example, 100 hours. The RRA of step 328 and the oxygen-annealing of step 330 can be conducted in air, in an oxygen-rich gas having an oxygen content greater than that of air, or in an "oxygen-deficient" gas, in which the relative amount of oxygen is less than the relative amount of oxygen in air. Preferably, they are performed in $O_2$ gas. Although a furnace anneal of step 330 is optional, it tends to improve ferroelectric polarizability and other electronic properties of the thin film.

A top electrode is formed in step 334. Preferably, the electrode is formed by RF sputtering of a platinum single layer, but it also may be formed by DC sputtering, ion beam sputtering, vacuum deposition, or other appropriate conventional deposition process. If desirable for the electronic device design, before the metal deposition, the ferroelectric layered superlattice material may be patterned using conventional photolithography and etching, and the top electrode is then patterned in a second process after deposition. In the examples described below, the top electrode and layered superlattice material are patterned together using conventional photolithography techniques and ion beam milling.

As deposited, the adhesion of the top electrode to the thin film of layered superlattice material is usually weak. The adhesion is improved by post-annealing in step 334. The post-anneal may be performed in an electric furnace at a temperature between 500° C. and 750° C. A post-anneal below 500° C. does not improve the adhesion of the electrode, and the resulting capacitor devices would tend to be extremely leaky, and shorted in the worst cases. Preferably, post-annealing in step 334 is performed at a temperature in the range of from 500° C. to 700° C. that does not exceed the temperature of the RRA and annealing in steps 328 and 330. Preferably, post-annealing step 334 is conducted similarly to step 328, that is, as a post-RRA using the same ramping rate, hold temperature and holding time as in step 328.

The post-RRA, or alternatively a conventional furnace post-anneal, in step 334 releases the internal stress in the top electrode and in the interface between the electrode and the ferroelectric thin film. At the same time, the post-anneal step 334 reconstructs microstructure in the layered superlattice material resulting from the sputtering of the top electrode, and as a result improves the properties of the material. The effect is the same whether the post-anneal is performed before or after the patterning steps mentioned in connection with step 336 below. With regard to most electrical properties, unreactive gas, such as helium, argon, and nitrogen, may be used with approximately the same result as with oxygen, thereby decreasing exposure of the integrated circuit to oxygen at elevated temperature.

The circuit is generally completed in step 336, which can include a number of substeps; for example, deposition of an ILD, patterning and milling, and deposition of wiring layers.

Figure 4:
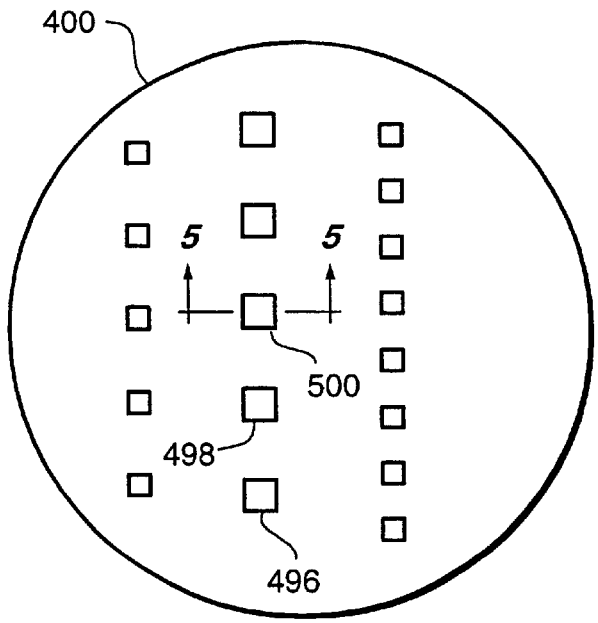
FIG. 4 is a top view of an exemplary wafer on which thin film capacitors fabricated in accordance with the invention are shown greatly enlarged.
Figure 5:
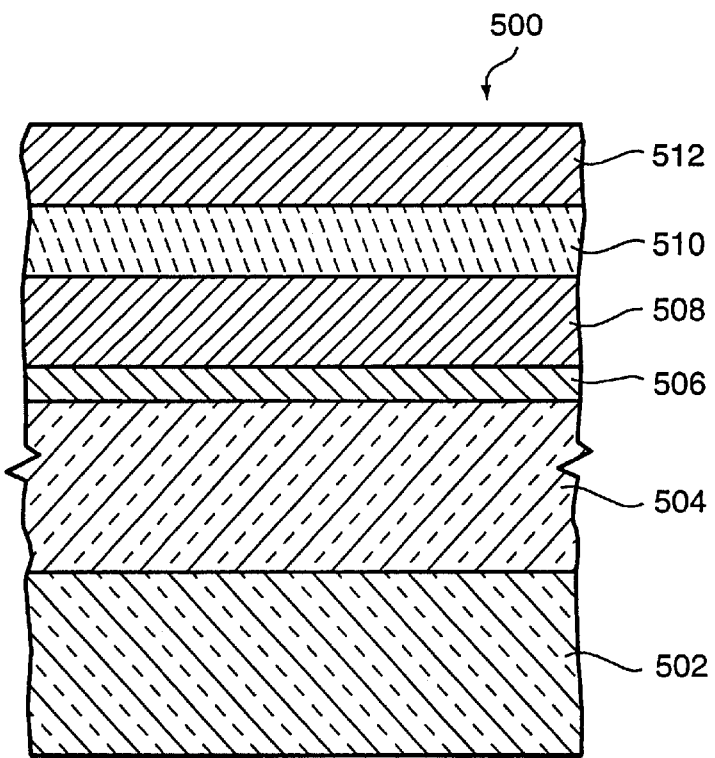
FIG. 5 is a portion of a cross-section of FIG. 4 taken through the lines 5—5, illustrating an exemplary thin film capacitor fabricated in accordance with the invention.

FIG. 4 is a top view of an exemplary wafer 400 on which thin film capacitors 496, 498 and 500 fabricated on substrate 410 in accordance with the invention are shown greatly enlarged. FIG. 5 is a portion of a cross-section of FIG. 4 taken through the lines 5—5, illustrating thin film capacitor 500 fabricated in accordance with the invention. Section 510 includes a silicon dioxide layer 504 formed on a silicon crystal substrate 502. A titanium layer is sputtered onto layer 504, and the titanium is later oxidized to form a titanium oxide layer 506. Then bottom electrode 508 made of platinum is sputter-deposited on layer 506. Layer 510 represents a ferroelectric thin film made in accordance with the invention, and layer 512 represents the top electrode made of platinum.

EXAMPLE 1

Ferroelectric thin film capacitors, as depicted in FIGS. 4 and 5, containing a thin film of strontium bismuth tantalate layered superlattice material were fabricated in accordance with the invention. The remanent polarizations of the capacitors were measured and compared to study the effects of processing conditions on ferroelectric polarizability.

Each of a series of P-type 100 Si wafer substrates 502 was oxidized to form a layer of silicon dioxide 504. The substrate was dehydrated in a vacuum oven at 80° C. for 30 minutes. An adhesive layer 506 consisting substantially of titanium and having a thickness of 100 nm was sputter-deposited on the substrate, using an argon atmosphere, 8 mTorr pressure and 0.53 amps. Then, under similar sputter conditions, a bottom platinum electrode 508 layer having a thickness of 200 nm was deposited. On each wafer, the bottom electrode layer was pre-annealed at 650° C. for 30 minutes in $O_2$ gas flowing at 6 l/m, using 10 minute push-pull. A dehydration bake was conducted in a vacuum oven at 180° C. for 30 minutes.

SBT thin films were fabricated using a strontium bismuth tantalate (SBT) liquid precursor solution purchased from the Kojundo Chemical Corporation. The solution contained amounts of metal compounds corresponding to the stoichiometric formula $Sr_{0.9}Bi_{2.2}Ta_2O_9$. The 0.2 mol/l precursor solution contained: bismuth 2-ethylhexanoate, strontium 2-ethylhexanoate, and tantalum 2-ethylhexanoate in n-octane. The 0.2 molar solution was diluted with n-butyl acetate to 0.12 molar final precursor solution immediately before use.

Figure 6:
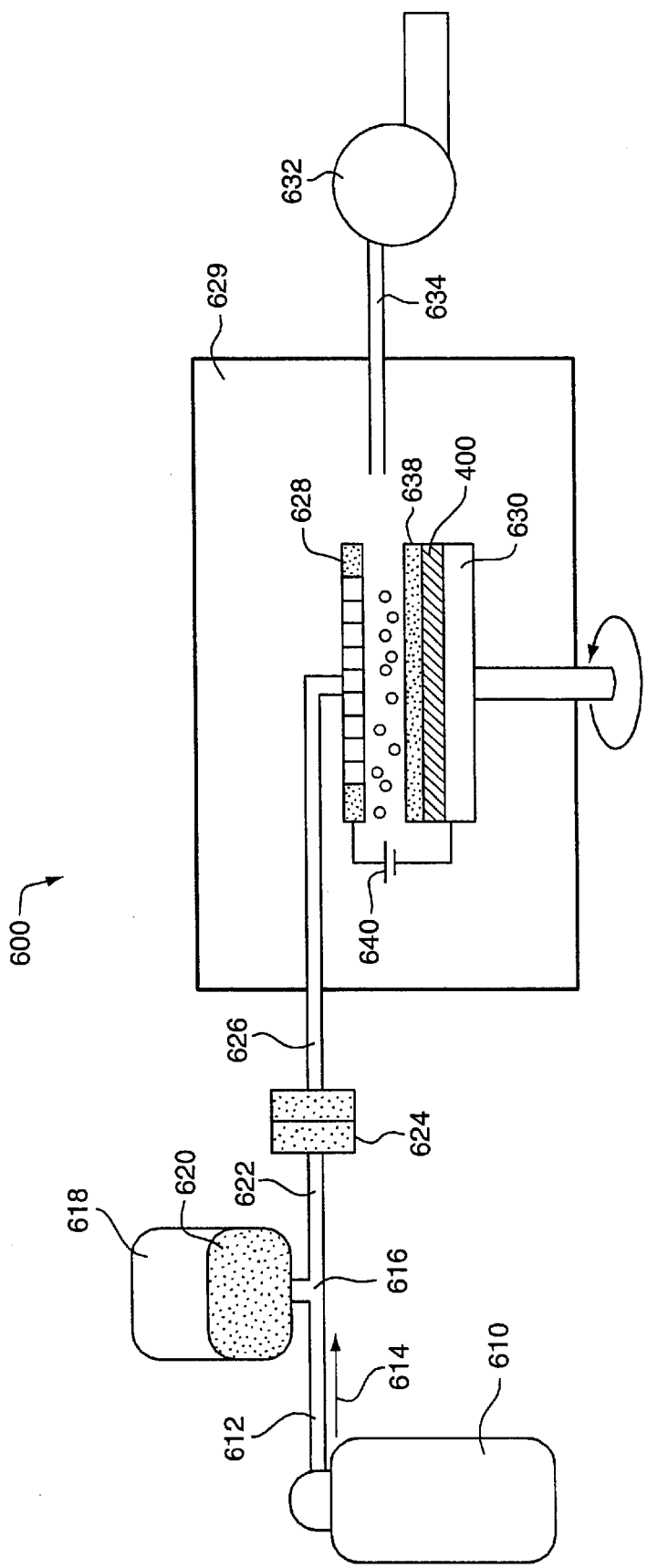
FIG. 6 is a sketch of an LSMCD apparatus for forming a ferroelectric thin film in accordance with the invention.

On each wafer, a liquid coating of the precursor was deposited on bottom electrode layer 508 using a LSMCD apparatus 600, as depicted in the sketch of FIG. 6. LSMCD apparatus 600 comprises a carrier gas source 610 and gas line 612, through which carrier gas flows in the direction of arrow 614 to connection 616, which connects gas line 614 to atomizer 618. Precursor solution 620 in atomizer 618 is atomized into the carrier gas, forming a mist that flows in mist line 622 through filter 624. Filter 624 removes liquid mist particles that are larger than about one $\mu$m in diameter. The filtered mist travels through inlet line 626 and shower head assembly 628 into deposition chamber 629. Deposition chamber 629 contains substrate holder 630. The pressure and contents of deposition chamber 629 are controlled by pump system 632, connected to the interior of deposition chamber 629 by outlet line 634.

Each prepared wafer 400 was placed on substrate holder 630. Argon carrier gas was used to create a mist from the final SBT precursor solution 620 in atomizer 618. Mist particles exiting from shower head assembly 628 formed a liquid coating 638 on bottom electrode 508 of each wafer. The deposition of the mist particles was enhanced by application of 8 to 9 kV bias from voltage source 640 between shower head assembly 628 and substrate holder 630. On each wafer, a liquid coating with a thickness of 100 nm was deposited at a deposition rate of about 10 nm/min. The liquid coating was dried by baking on a hot plate in $O_2$ gas for one minute at 160° C., followed by four minutes at 260° C.

Selected wafers were subjected to various conditions of heat treatments by RRA and furnace annealing to promote reaction of the precursor compounds on each wafer substrate and to crystallize polycrystalline metal oxide layered superlattice material. Each of three wafers were given an RRA treatment only, with a nominal ramping rate of 100° C./second, at a hold temperature of 650° C. and for a holding time of 4 minutes, 10 minutes, and 30 minutes, respectively. Three other wafers were given similar RRA treatment, but the RRA was followed by a furnace anneal ("FA") in oxygen at 650° C. for 30 minutes.

These steps formed ferroelectric thin films 510 having a thickness of about 100 nm. Platinum was sputter-deposited on each wafer to make a top electrode layer 512 with a thickness of about 200 nm. The top electrode 512 and strontium bismuth tantalate 510 layers were milled to form capacitors, and then ashing was performed, followed by a furnace post-anneal for 30 minutes at 650° C. in $O_2$ gas. The capacitors had a surface area of 6940 $\mu m^2$.

Figure 7:
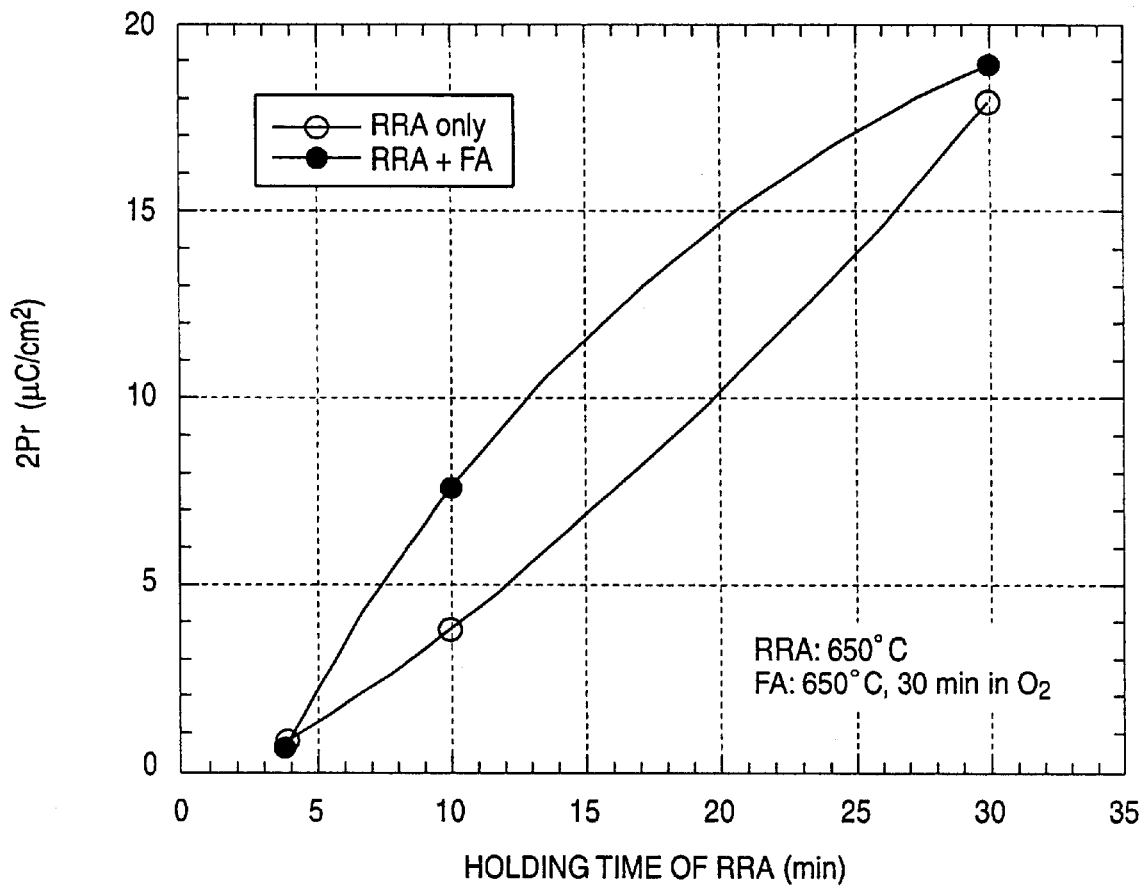
FIG. 7 is a graph of remanent polarization, 2Pr, in units of $\mu C/cm^2$, measured at 5 volts, plotted as a function of holding time, in capacitors formed using RRA at 650° C.

The remanent polarizations of the exemplary capacitors of the wafers were calculated from hysteresis curves of the capacitors. The remanent polarization, 2Pr, in units of $\mu C/cm^2$, at an applied voltage of 5 volts was plotted as a function of RRA holding time in the graph of FIG. 7. The empty circles in the graph represent data from capacitors in which the thin film of layered superlattice material received RRA only, with no FA treatment. The solid circles represent data of capacitors in which the ferroelectric thin film received both RRA and FA treatment. The data in the graph of FIG. 7 indicate that when the RRA was conducted for a holding time of 5 minutes or less, the resulting ferroelectric polarizability, calculated as 2Pr, was too low for most integrated circuit applications. At a holding time of about 10 minutes, the 2Pr values were in a range around 5 $\mu C/cm^2$, which is suitable for certain ferroelectric devices, in particular, for some ferroelectric FET applications. At 10 minutes, the 2Pr value in the capacitor with FA treatment was significantly higher than in the capacitor that had only RRA and no FA. In the capacitor that had only RRA for 30 minutes, the 2Pr value was about 18 $\mu/cm^2$, which is suitable for use in practically all nonvolatile FeRAM device. An FA treatment after an RRA of 30 minutes did not increase the 2Pr value significantly.

The good polarizability of the capacitor with an RRA for 30 minutes, with no FA, was unexpected. Having virtually the same thermal budget as the capacitor having 4-minute RRA and 30-minute FA, the 30-minute RRA capacitor displayed the relatively high 2Pr value of 18 $\mu cm^2$. It was previously believed that layered superlattice materials required heating treatments at elevated temperatures of at least 700° C., preferably higher, for a duration on the order of several hours. The good electronic characteristics achievable with an RRA at a hold temperature less than 700° C. for shorter time periods make it possible to decrease fabrication costs and to improve integrated circuit quality by minimizing the time of exposure of the circuit to oxygen at elevated temperatures.

There has been described a method using RRA for making electronic devices containing layered superlattice materials. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiment described, without departing from the inventive concepts. It is also evident that the steps recited may in some instances be performed in a different order; or equivalent structures and processes may be substituted for the various structures and processes described; or a variety of different precursors may be used. Consequently, the invention is to be construed as embracing each and every novel feature and novel combination of features present in and/or possessed by the fabrication processes, electronic devices, and electronic device manufacturing methods described.

We claim:

1. A method of fabricating a thin film of layered superlattice material comprising steps of:

providing a substrate;

providing a precursor containing metal moieties in effective amounts for forming a layered superlattice material upon heating said precursor;

applying said precursor to said substrate to form a coating; and conducting a rapid ramping anneal ("RRA") of said coating at a hold temperature in a range of from 500° C. to 750° C. for a holding time at said hold temperature in a range of from 5 minutes to 120 minutes to form said thin film of layered superlattice material on said substrate.

2. A method as in claim 1 wherein said rapid ramping anneal is conducted in an oxygen-containing atmosphere.

3. A method as in claim 1 wherein said rapid ramping anneal is conducted in substantially pure $O_2$ gas.

4. A method as in claim 1 wherein said hold temperature does not exceed 700° C.

5. A method as in claim 1 wherein said hold temperature is 650° C.

6. A method as in claim 1 wherein said holding time is not less than 15 minutes.

7. A method as in claim 1 wherein said holding time is not less than 30 minutes.

8. A method as in claim 1 wherein said hold temperature is 650° C. and said holding time is not less than 30 minutes.

9. A method as in claim 1 wherein said rapid ramping anneal is conducted with an actual ramping rate in a range of from 10° to 100° C. per second.

10. A method as in claim 9 wherein said rapid ramping anneal is conducted with an actual ramping rate of 50° C. per second.

11. A method as in claim 1, further comprising a step of baking said coating on said substrate at a temperature not exceeding 400° C. before said conducting said rapid ramping anneal.

12. A method as in claim 11 wherein said baking is conducted for a time period not exceeding 15 minutes.

13. A method as in claim 1, further comprising a step of furnace annealing said coating after said rapid ramping anneal.

14. A method as in claim 13 wherein said furnace annealing is conducted in an oxygen-containing atmosphere.

15. A method as in claim 13 wherein said furnace annealing is conducted at a temperature in a range of from 600° C. to 700° C.

16. A method as in claim 13 wherein said furnace annealing is conducted for a time period in a range of from 5 minutes to 120 minutes.

17. A method as in claim 1 wherein said substrate comprises a first electrode, and further comprising steps of forming a second electrode on said thin film, after said rapid ramping anneal, to form a capacitor, and subsequently performing a step of post-annealing.

18. A method as in claim 17 wherein said post-annealing is conducted at a temperature in a range of from 600° C. to 700° C. for a time period in a range of from 5 minutes to 60 minutes.

19. A method as in claim 17 wherein said post-annealing is conducted in an oxygen-containing atmosphere.

20. A method as in claim 1, further comprising a step of forming an electrically conductive barrier layer on said substrate prior to said applying said precursor.

21. A method as in claim 1 wherein said layered superlattice material comprises strontium bismuth tantalate.

22. A method as in claim 1 wherein said layered superlattice material comprises strontium bismuth tantalum niobate.

23. A method as in claim 22 wherein said precursor contains metal atoms in molar proportions corresponding to a stoichiometric formula $Sr_a Bi_b (Ta_{1-x} Nb_x)_c O_{[9+(a-1)+(b-2)(1.5)+(c-2)(2.5)]}$, where $0.8 \leq a \leq 1$, $2 \leq b \leq 2.2$, $0 \leq x \leq 0.3$ and $1.9 \leq c \leq 2.1$.

24. A method of fabricating a thin film of layered superlattice material comprising:

providing a substrate;

providing a precursor containing metal moieties in effective amounts for forming a layered superlattice material upon heating said precursor;

applying said precursor to said substrate to form a coating; and after said applying said precursor, heating said coating to a temperature in a range of from 500° C. to 750° C. essentially only by conducting a rapid ramping anneal ("RRA").

25. A method as in claim 24 wherein said rapid ramping anneal is conducted at a hold temperature in a range of from 500° C. to 700° C.

26. A method as in claim 24 wherein said rapid ramping anneal is conducted using a holding time in a range of from 5 minutes to 120 minutes.

27. A method as in claim 24, further comprising forming a top electrode on said thin film, and then conducting a post-RRA.

* * * * *